(12) United States Patent
Tan et al.

(10) Patent No.: US 9,545,024 B2
(45) Date of Patent: Jan. 10, 2017

(54) DIAMOND CUTTING TOOLS

(75) Inventors: Napthaneal Y. Tan, San Jose, CA (US); Chien-Ming Huang, Shenzhen (CN); Long Hin Lee, Shenzhen (CN); Lu Guojin, Beijing (CN); Yu Yundi, Dongguan (CN); Lv Peng, Dongguan (CN); Yu Yifeng, Dongguan (CN); Wu Chendong, Dongguan (CN); Shi Ze, Dongguan (CN)

(73) Assignee: Apple Inc., Cupertino, CA (US)

( * ) Notice: Subject to any disclaimer, the term of this patent is extended or adjusted under 35 U.S.C. 154(b) by 679 days.

(21) Appl. No.: 13/610,838

(22) Filed: Sep. 11, 2012

(65) Prior Publication Data

US 2013/0322975 A1 Dec. 5, 2013

Related U.S. Application Data

(60) Provisional application No. 61/689,170, filed on May 29, 2012.

(51) Int. Cl.
*B23C 5/12* (2006.01)
*H05K 5/04* (2006.01)
(Continued)

(52) U.S. Cl.
CPC . *H05K 5/04* (2013.01); *B23C 5/00* (2013.01); *B23C 5/1081* (2013.01); *B23P 11/00* (2013.01);
(Continued)

(58) Field of Classification Search
CPC ............ Y10T 409/303752; Y10T 409/303808; Y10T 409/303864; Y10T 409/30392; Y10T 409/303976; Y10T 409/304032; Y10T 409/304; Y10T 409/088; Y10T 409/304144; Y10T 409/3042;Y10T 409/304256; Y10T 409/304312; Y10T 409/304368; Y10T 409/304424; Y10T 409/30448; Y10T 409/304536; Y10T 409/304592; Y10T 409/304648; Y10T 409/304704; Y10T 409/304476; Y10T 409/304876; Y10T 409/304872; Y10T 409/304928; Y10T 409/304984; Y10T 409/30504; Y10T 409/30596; Y10T 409/305152; Y10T 409/305208; Y10T 29/47; B23C 3/12; B23C 2220/28; B23C 2270/06
(Continued)

(56) References Cited

U.S. PATENT DOCUMENTS

| 4,411,564 A | 10/1983 | Johnson |
| 4,662,801 A | 5/1987 | Kondou et al. |

(Continued)

FOREIGN PATENT DOCUMENTS

| CN | 2647479 Y | 10/2004 |
| CN | 201505761 | 6/2010 |

(Continued)

OTHER PUBLICATIONS

Machine Translation of JP 05-277823, Apr. 13, 2016, pp. 4-8.*

(Continued)

*Primary Examiner* — Daniel Howell
*Assistant Examiner* — Nicole N Ramos
(74) *Attorney, Agent, or Firm* — Downey Brand LLP

(57) ABSTRACT

The embodiments described herein relate to methods, systems, and structures for cutting a part to form a highly reflective and smooth surface thereon. In some embodiments, the part includes substantially horizontal and vertical surfaces with edges and corners. In described embodiments, a diamond cutter is used to cut a surface of the part during a milling operation where the diamond cutter contacts the (Continued)

part a number of times with each rotation of the spindle of a milling machine. The diamond cutter has a cutting edge and a land. The cutting edge cuts the surface of the part and the land burnishes the surface of the part to form a highly reflective and smooth surface. Thus, the diamond cutter cuts and burnishes portions of the part, thereby eliminating a subsequent polishing step.

18 Claims, 12 Drawing Sheets

(51) Int. Cl.
| | |
|---|---|
| B23P 11/00 | (2006.01) |
| B23P 17/00 | (2006.01) |
| G03F 1/38 | (2012.01) |
| H01Q 1/24 | (2006.01) |
| H04M 1/02 | (2006.01) |
| H05K 5/02 | (2006.01) |
| H05K 13/00 | (2006.01) |
| C25D 11/02 | (2006.01) |
| C25D 7/00 | (2006.01) |
| C25D 11/12 | (2006.01) |
| H05K 5/03 | (2006.01) |
| H01Q 1/42 | (2006.01) |
| C25D 11/34 | (2006.01) |
| B23C 5/10 | (2006.01) |
| B23C 5/00 | (2006.01) |
| B23P 17/02 | (2006.01) |
| H04M 1/11 | (2006.01) |
| C25D 11/24 | (2006.01) |

(52) U.S. Cl.
CPC ............... *B23P 17/00* (2013.01); *B23P 17/02* (2013.01); *C25D 7/00* (2013.01); *C25D 11/02* (2013.01); *C25D 11/022* (2013.01); *C25D 11/12* (2013.01); *C25D 11/34* (2013.01); *G03F 1/38* (2013.01); *H01Q 1/243* (2013.01); *H01Q 1/42* (2013.01); *H04M 1/0254* (2013.01); *H04M 1/11* (2013.01); *H05K 5/02* (2013.01); *H05K 5/0217* (2013.01); *H05K 5/0247* (2013.01); *H05K 5/03* (2013.01); *H05K 13/00* (2013.01); *B23C 2220/04* (2013.01); *B23C 2220/16* (2013.01); *B23C 2220/20* (2013.01); *B23C 2220/28* (2013.01); *B23C 2220/48* (2013.01); *B23C 2226/31* (2013.01); *B23C 2226/315* (2013.01); *C25D 11/246* (2013.01); *H04M 1/0249* (2013.01); *Y10T 29/47* (2015.01); *Y10T 29/49002* (2015.01); *Y10T 29/49826* (2015.01); *Y10T 156/10* (2015.01); *Y10T 156/1064* (2015.01); *Y10T 407/1906* (2015.01); *Y10T 409/300896* (2015.01); *Y10T 409/30952* (2015.01); *Y10T 409/303752* (2015.01)

(58) Field of Classification Search
USPC .............. 409/131–174, 183–218; 29/90.01
See application file for complete search history.

(56) References Cited

U.S. PATENT DOCUMENTS

| | | | | |
|---|---|---|---|---|
| 4,844,670 | A | | 7/1989 | Heule |
| 4,896,638 | A | * | 1/1990 | Shepley ............... B23C 3/055 123/188.8 |
| 4,993,891 | A | | 2/1991 | Kaminiski et al. |
| 5,022,797 | A | * | 6/1991 | Sawa et al. ................ 407/119 |
| 5,049,011 | A | | 9/1991 | Bohnet et al. |
| 5,063,980 | A | | 11/1991 | Schultz |
| 5,185,956 | A | | 2/1993 | Steere, Jr. |
| 5,463,503 | A | * | 10/1995 | Kawada et al. ............. 359/838 |
| 5,567,092 | A | * | 10/1996 | Post ................. B23C 5/006 407/36 |
| 5,605,420 | A | * | 2/1997 | Feldsine ............. B23C 5/006 407/32 |
| 5,655,860 | A | | 8/1997 | Oles |
| 5,720,583 | A | * | 2/1998 | Bohnet ............. B23C 5/202 407/113 |
| 6,053,672 | A | * | 4/2000 | Satran ................ B23C 5/00 407/113 |
| 6,217,262 | B1 | | 4/2001 | Wright |
| 6,474,204 | B1 | | 11/2002 | Suzuki et al. |
| 6,629,806 | B1 | * | 10/2003 | Santorius ............. B23C 3/06 409/132 |
| 6,705,184 | B2 | * | 3/2004 | Cardemon ......... B23B 29/03403 82/1.11 |
| 6,913,424 | B2 | | 7/2005 | Yoshihiro et al. |
| 6,942,433 | B2 | | 9/2005 | Schleinkofer et al. |
| 6,945,740 | B2 | * | 9/2005 | Svenningsson ........ B23C 5/207 407/113 |
| 6,979,154 | B2 | * | 12/2005 | Mina ................. B23C 5/109 407/113 |
| 7,044,697 | B2 | | 5/2006 | Kodaka et al. |
| 7,125,205 | B2 | | 10/2006 | Sheffler |
| 7,134,811 | B2 | | 11/2006 | Francis et al. |
| 7,140,812 | B2 | | 11/2006 | Bryan et al. |
| 7,431,541 | B2 | * | 10/2008 | Chang ................. 407/113 |
| 7,547,164 | B2 | * | 6/2009 | Hessman ............. B23C 5/207 407/113 |
| 7,607,374 | B2 | | 10/2009 | Hall |
| 7,614,326 | B2 | * | 11/2009 | Peltonen .......... B23B 29/03403 408/147 |
| 7,625,161 | B1 | | 12/2009 | Ruy Frota de Souza |
| 7,765,902 | B2 | | 8/2010 | Kuroda et al. |
| 8,011,863 | B2 | | 9/2011 | Maurer |
| 8,434,974 | B2 | | 5/2013 | Spitzenberger et al. |
| 9,061,358 | B2 | | 6/2015 | Tan et al. |
| 2004/0042858 | A1 | | 3/2004 | Sheffler |
| 2006/0067797 | A1 | * | 3/2006 | Calamia ............... B23C 5/10 407/53 |
| 2007/0031201 | A1 | | 2/2007 | Maeda |
| 2007/0089574 | A1 | * | 4/2007 | Murakami et al. ............. 82/158 |
| 2007/0280792 | A1 | | 12/2007 | Belee et al. |
| 2008/0181739 | A1 | | 7/2008 | Chang |
| 2008/0292415 | A1 | | 11/2008 | Kuroda et al. |
| 2009/0060662 | A1 | | 3/2009 | Maurer |
| 2009/0116913 | A1 | | 5/2009 | Xiao et al. |
| 2009/0234490 | A1 | * | 9/2009 | Suprock et al. ............. 700/159 |
| 2011/0117342 | A1 | | 5/2011 | Sugita et al. |
| 2013/0045059 | A1 | * | 2/2013 | Bozkurt ............. B23C 5/06 409/131 |
| 2013/0302099 | A1 | | 11/2013 | Choi et al. |
| 2014/0069245 | A1 | | 3/2014 | Tan et al. |
| 2015/0196981 | A1 | | 7/2015 | Tan et al. |

FOREIGN PATENT DOCUMENTS

| | | |
|---|---|---|
| CN | 101934398 | 1/2011 |
| CN | 201693623 | 1/2011 |
| JP | 05277823 A * | 10/1993 |
| WO | WO0238334 | 5/2002 |

OTHER PUBLICATIONS

First Office Action dated Dec. 30, 2016 for Chinese Application No. 201380039176.1.
Chinese Application No. 201310207362.3 Office Action & Search Report Dated Jul. 20, 2016.
Chinese Application No. 201410407652.7 First Office Action Dated Jul. 13, 2016.

* cited by examiner

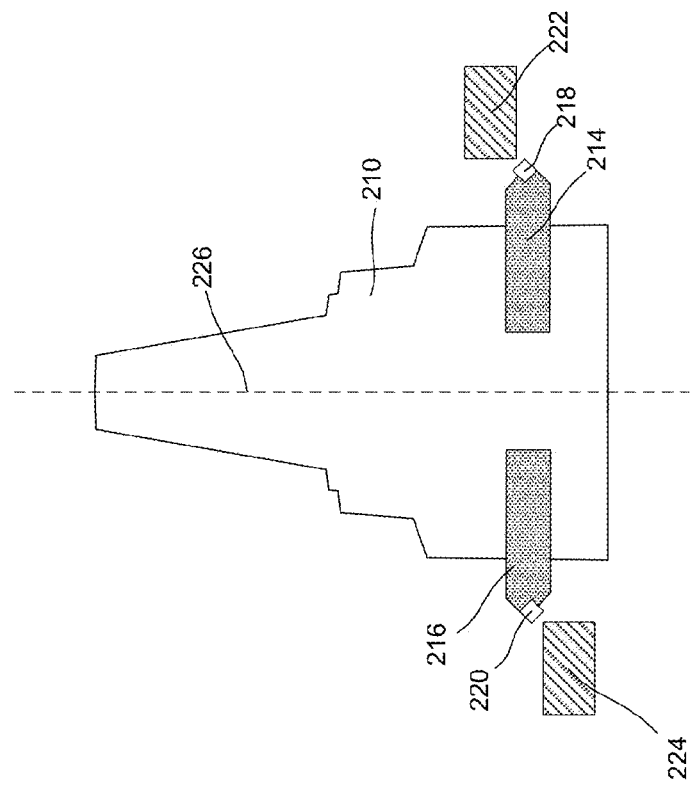
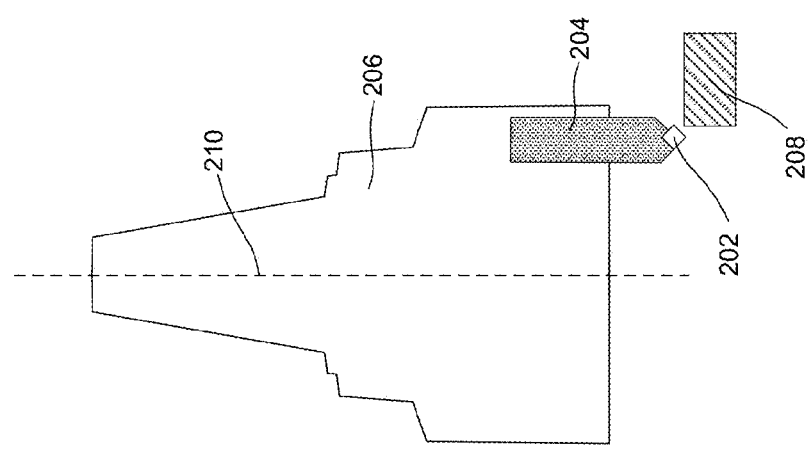
FIG. 2B
FIG. 2A

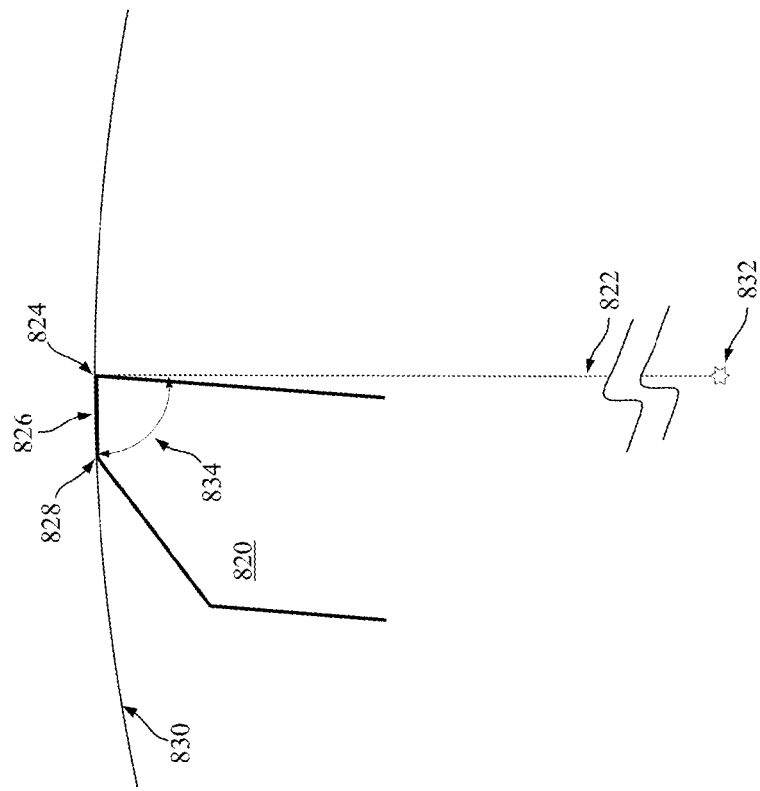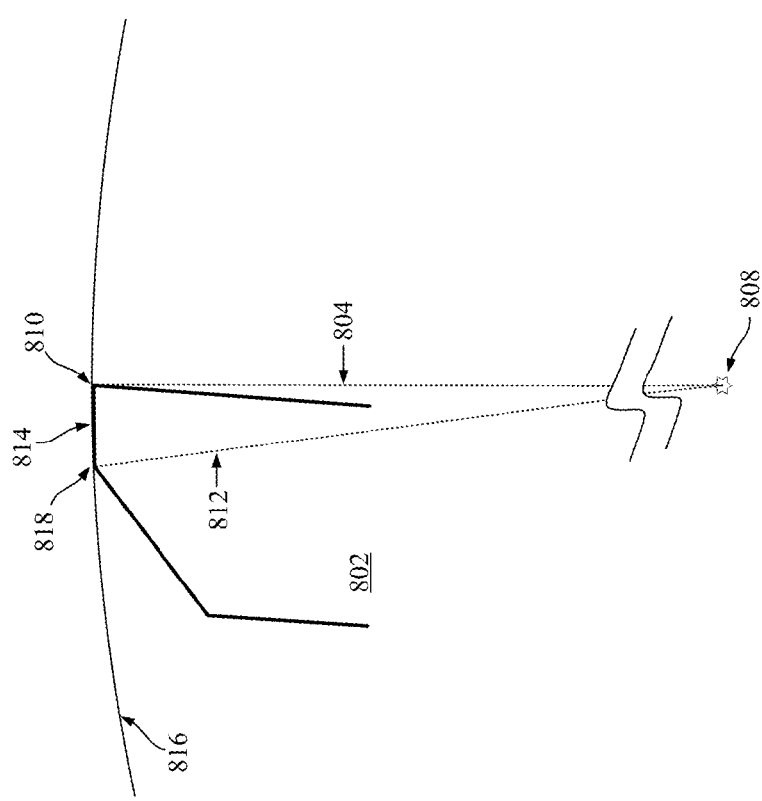

DIAMOND CUTTING TOOLS

CROSS REFERENCE TO RELATED APPLICATIONS

This application claims priority to U.S. Provisional Patent Application No. 61/689,170, filed May 29, 2012, and entitled "COMPONENT FOR AN ELECTRONIC DEVICE," which is incorporated herein by reference in its entirety and for all purposes.

FIELD OF THE DESCRIBED EMBODIMENTS

The described embodiments relate generally to cutting and to surface finishing. More specifically, methods and tools for cutting a highly reflective and smooth surface on a finished product.

BACKGROUND

Many consumer products such as electronic devices have surfaces that are fabricated from metal. In many cases, these metal surfaces are shiny and reflective so as to enhance the look and feel of the products. In general, the smoother the metal surface, the more reflective it is. These metal surfaces are often polished to rub or chemically reduce the amount of irregular topography of the metal surface to leave a smoother profile, and thus a shinier surface.

In some cases, the metal surfaces can include sharp edges and features. Since standard polishing techniques typically reduce the overall topography of the metal surface, these standard polishing techniques can also erode the sharp edges leaving rounded or tapered features.

Therefore, providing a device and method for producing a highly reflective metal surface while keeping the integrity of the workpiece geometry, especially at sharp edges, is desired.

SUMMARY

This paper describes various embodiments that relate to cutting and finishing a surface using a cutter capable of cutting and burnishing a surface. Methods described are useful for cutting and providing a highly reflective and smooth surface to a part, such as an enclosure for an electronic device. The cutting methods can be used to cut metal or non-metal surfaces. In some embodiments, methods involve cutting a part having substantially horizontal and vertical surfaces. For example, methods described can be used to cut chamfered portions along an edge of an enclosure for an electronic device. The highly reflective and smooth surface can then be provided a protective layer, such as an anodization layer.

In described embodiments, the cutter has a cutting edge, a heel and a land disposed between the cutting edge and heel. In some embodiments, the cutter is made of diamond material, such as mono crystalline diamond or poly crystalline diamond. The cutter can be used with a milling machine where the cutter contacts a workpiece a number of times with each rotation of the spindle of the milling machine. The cutting edge cuts the surface of the workpiece and the land burnishes the surface of the workpiece to form a highly reflective and smooth surface. In some embodiments the heel of the cutter can also burnish the surface of the workpiece. Thus, the cutter can cut and burnish portions of the workpiece in one operation, thereby eliminating a subsequent polishing step.

According to one embodiment, a cutting tool assembly is described. The cutting tool assembly includes a holder configured to rotate about an axis. The cutting tool assembly also includes a cutting tool radially attached to the holder. The cutting tool includes a shank having a first end secured to the holder. The cutting tool also includes a diamond cutter attached to a second end of the shank, the second end being opposite the first end. The diamond cutter includes a cutting edge, a heel and a land disposed between the cutting edge and heel. When the holder rotates about the axis, the cutting edge removes material from a workpiece to form a second surface having a number of peaks and troughs. The peaks reduce an overall reflectiveness and smoothness of the second surface. The land removes substantially all the peaks to form a third surface that is highly reflective and smooth.

According to another embodiment, a cutting tool system for cutting a highly reflective finish on a surface of a workpiece is described. The cutting tool system includes a milling machine having a spindle with an axis of rotation. The cutting tool system additionally includes a tool holder configured to rotate about an axis of rotation. The cutting tool system also includes a cutting tool radially and removably coupled to the tool holder. The cutting tool includes a shank having a first end secured to the tool holder. The cutting tool also includes a cutter attached to a second end of the shank. The second end is opposite the first end. The cutter includes a cutting edge, a heel and a land disposed between the cutting edge and heel. When the cutting tool rotates about the axis of rotation, the cutting edge removes material from a workpiece to form a second surface having the peaks and troughs. The peaks reduce an overall reflectiveness and smoothness of the second surface. The land removes substantially all the peaks to form a third surface that is highly reflective and smooth.

According to an additional embodiment, a method of calibrating a cutting tool system is described. The cutting tool system includes a milling machine having a spindle and a cutter removably coupled to the milling machine. The cutter has a cutting edge, a heel and a land disposed between the cutting edge and the heel. The calibration method involves positioning the cutter in the milling machine such that the cutting edge, heel and land are a radial distance from an axis of rotation of the spindle such that the cutter is positioned to cut a workpiece. The method also involves forming a reference line between the cutting edge and the axis. The method further involves measuring a first angle between the land and the reference line. The method additionally involves cutting a workpiece. The method also involves inspecting the workpiece to determine the reflectiveness and smoothness of a cut surface. The method additionally involves re-positioning the cutter within the milling machine such that the land is at a second angle from the reference line. The method further involves repeating the cutting, inspecting and re-positioning until a predetermined reflectiveness and smoothness of the cut piece is achieved.

BRIEF DESCRIPTION OF THE DRAWINGS

FIGS. 2A and 2B illustrate additional configurations of diamond cutting tool assemblies in accordance with described embodiments.

FIGS. 8A and 8B illustrate diamond cutters undergoing two different alignment procedures in accordance with described embodiments.

DETAILED DESCRIPTION OF SELECTED EMBODIMENTS

Figure 1:
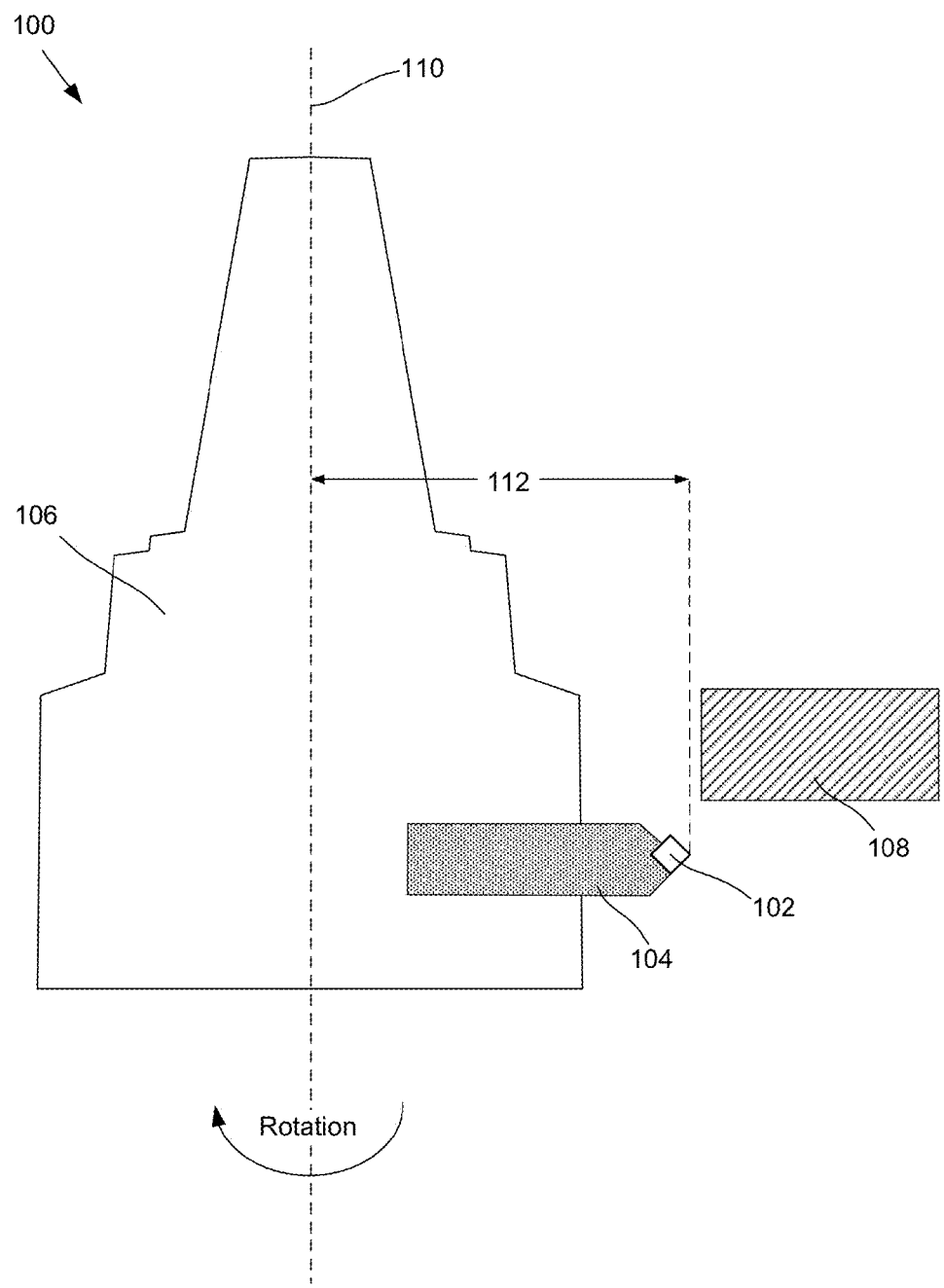
FIG. 1 illustrates a diamond cutting tool assembly in accordance with described embodiments.

The following disclosure describes various embodiments of electronic devices, such as portable electronic devices including, for example, mobile telephones. Certain details are set forth in the following description and Figures to provide a thorough understanding of various embodiments of the present technology. Moreover, various features, structures, and/or characteristics of the present technology can be combined in other suitable structures and environments. In other instances, well-known structures, materials, operations, and/or systems are not shown or described in detail in the following disclosure to avoid unnecessarily obscuring the description of the various embodiments of the technology. Those of ordinary skill in the art will recognize, however, that the present technology can be practiced without one or more of the details set forth herein, or with other structures, methods, components, and so forth.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

In the detailed description, reference is made to cutting a workpiece or part. In certain embodiments, the part can be made of metal, such as aluminum or aluminum alloy. However, a person of skill in the art would recognize that in the context of the present technology, the term part can refer to any suitable material capable of undergoing a cutting procedure to form a highly reflective surface, including metal, plastic, glass, and so forth.

The embodiments described herein relate to methods, systems, and structures for forming a highly reflective surface cut into a part. In the described embodiments, a diamond cutter is used to cut a surface of the part. The diamond cutter can be a poly crystalline diamond (PCD) or a mono crystalline diamond (MCD). In described embodiments, the diamond cutter has a cutting edge, a land and a heel. The cutting edge removes surface material from the surface of the part to form a second scalloped surface having peaks and troughs, the peaks reducing the overall reflective or smooth appearance of the second surface. The land, and optionally heel, subsequently burnishes the second surface by reducing the peaks to form a highly reflective and smooth finished surface. Thus, the diamond cutter simultaneously cuts and burnishes portions of the part, eliminated the need for an additional polishing step. In preferred embodiments, the diamond cutter is configured to have a relatively long cutting radius, which results in the smoother highly reflective finished surface.

In described embodiments, a diamond cutter is mounted in a machining tool, such as a computerized numerical control (CNC) machining tool, for cutting a part. In certain embodiments a diamond cutter is configured to be used in a milling machine, wherein the diamond cutter is rotated in a circular motion around a spindle axis and moved along the workpiece surface to contour the surface of the workpiece. FIG. 1 shows a cutting tool assembly 100 in accordance with described embodiments. As shown, cutting tool assembly 100 includes tool holder 106 and cutting tool, which includes diamond cutter 102 and shank 104. Diamond cutter 102 is coupled to shank 104 using, for example, a brazing procedure. Shank 104 is configured to removably fit into tool holder 106, which is in turn configured to be positioned in a milling machine (not shown). Cutting tool assembly 100 is positioned to cut workpiece 108, which can be secured using any of a number of suitable methods, such as by use of a clamp. During a cutting operation, cutting tool assembly 100 rotates about spindle axis 110 while secured workpiece 108 is moved toward diamond cutter 102. In alternative embodiments, cutting tool assembly can be moved toward secured workpiece 108. The cutting edge of diamond cutter 102 is positioned at a cutting radius 112 from the spindle axis 110. With each rotation of the spindle, diamond cutter 102 takes a cut at the surface of workpiece 108. During a milling cutting operation, the cutting edge of diamond cutter 102 enters and exits workpiece 108 a number of times, also known as interrupted cutting. This interrupted cutting can produce a scalloped surface on workpiece 108, which can diminish the overall reflective or smooth appearance of the cut surface. The cutting tool and methods described herein can reduce the amount of scalloped surface on workpiece 108, thereby forming a highly reflective and smooth finished surface on workpiece 108. Details regarding reducing a scalloped surface in accordance with embodiments will be described below.

FIGS. 2A and 2B illustrate additional configurations of cutting tool assemblies in accordance with described embodiments. At FIG. 2A, diamond cutter 202 is coupled to shank 204, which is in turn removably coupled to tool holder 206. Tool holder 206 is configured to be mounted in a milling tool (not shown). In this case, shank 204 is positioned in tool holder 206 such that the length of shank 204 is substantially parallel to the spindle axis of rotation 210. Workpiece 208 is positioned such that diamond cutter 202 can cut the surface if workpiece 208. At FIG. 2B, holder 212 is configured to hold two shanks 214 and 216, each of which have diamond cutters 218 and 220, respectively, disposed thereon. In this case, both shanks 214 and 216 are substantially perpendicular to spindle axis of rotation 226. Diamond cutter 218 is positioned to cut workpiece 222 and diamond cutter 220 is positioned to cut workpiece 224. In one embodiment, workpiece 222 and 224 are the same workpiece and diamond cutters 218 and 220 cut workpiece 222/224 at different times. For example, diamond cutter 218 can cut a first portion of workpiece 222/224. Next, workpiece 222/224 can be re-positioned in front of diamond cutter 220 and diamond cutter 200 can cut a second portion of workpiece 222/224.

Figure 3:
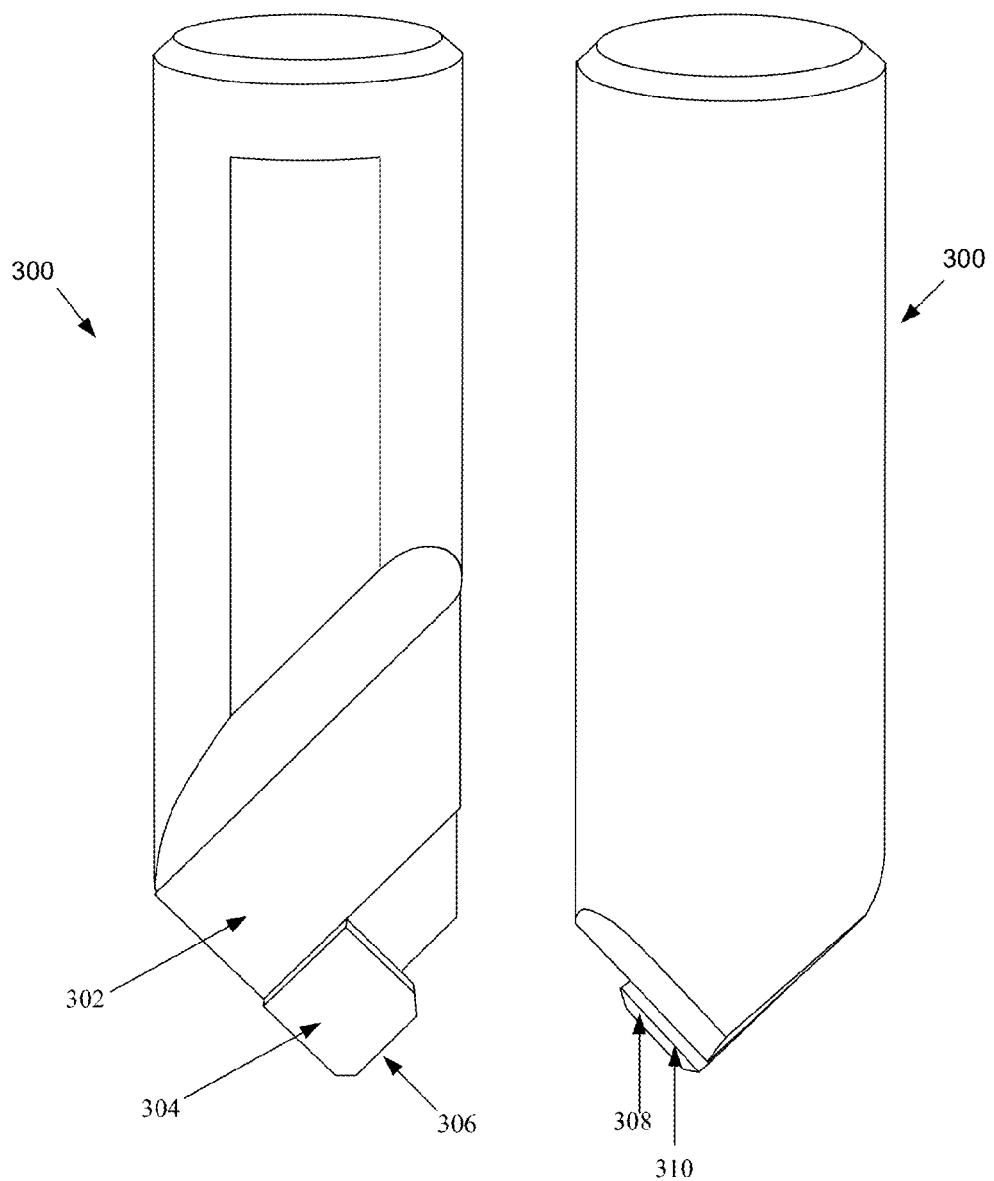
FIG. 3 illustrates two perspective side views of a diamond cutting tool in accordance with described embodiments.

FIG. 3 illustrates two perspective side views of a diamond cutting tool 300 in accordance with some embodiments of the disclosure. Cutting tool 300 includes shank 302 and diamond cutter 304. Diamond cutter 304 is mechanically coupled to shank 302 using, for example, a brazing procedure. The brazing procedure typically uses an alloy filler metal, such as silver containing filler alloy. As shown, diamond cutter 304 is positioned on the end of cutting tool 300 such that cutting edge 306, land 308 and optionally heel 310 can contact the workpiece during cutting. Shank 302 is preferably made from a rigid material, such as carbide, to rigidly maintain the position of cutting tool 300 during cutting, thereby allowing a smoother finished cut to be made. The shape of shank 302 can vary to maximize rigidity during the cutting procedure. The length of shank 302 can in part determine the cutting radius during cutting of a workpiece. Shank 402 can be configured to be mechanically coupled to a tool holder (not shown) which is attached to a spindle of a milling machine (not shown), which spins cutting tool 300 at high speeds. In certain embodiments, cutting tool 300 is positioned in a tool holder (not shown) such that the cutting radius is relatively large. By using a relatively large cutting radius, cuts made by cutting tool 300 can have relatively less scalloped portions, which will be discussed in detail below with reference to FIGS. 7A-7D. As cutting tool 300 is held rigidly in place by shank 302 within a tool holder (not shown), the cutting angle relative to the workpiece can stay steady.

Figure 4B:
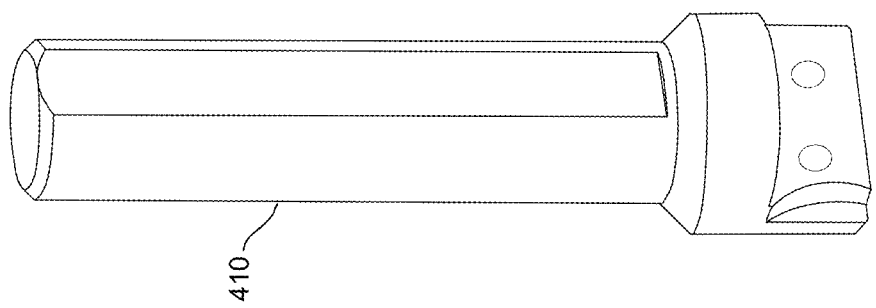
FIGS. 4A and 4B illustrate perspective side views of an insert and shank portions of a diamond cutting tool in accordance with described embodiments.
Figure 4A:
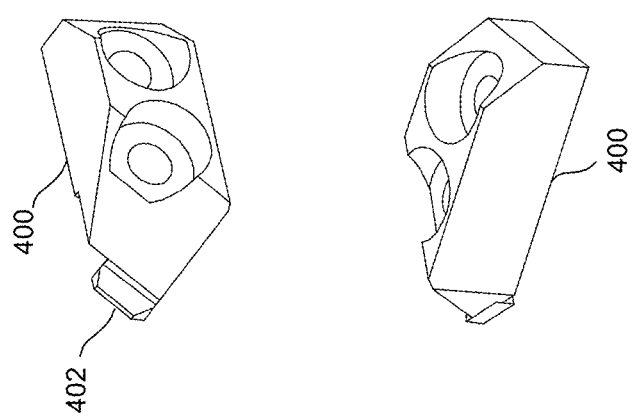

FIGS. 4A and 4B illustrate alternative embodiments of a cutting tool in accordance with the present technology. FIG. 4A shows two perspective views of an insert piece 400. Diamond cutter 402 is mechanically coupled to insert piece 400 at on end using, for example, a brazing procedure. The brazing procedure can use an alloy filler metal, such as silver containing filler alloy. Diamond cutter 402 is positioned on the end of insert piece 400 such that the heel, land and optionally heel can contact the workpiece during cutting. FIG. 4B shows shank 410 which can be connected to insert piece 400 using, for example, bolts to form the finished cutting tool. The cutting tool can then be inserted in the machining tool similarly to cutting tool 300 of FIG. 3.

As described above, embodiments of the disclosure involve the use of a diamond cutter which can be made of a polycrystalline diamond (PCD) or a mono crystalline diamond (MCD). In general, diamond is arranged in a cubic crystalline lattice system, in which carbon atoms are covalently bonded. The extremely high bond and lattice energy of diamond makes it extremely hard therefore a better cutting material than metals or carbides, for example. Two forms of diamond are polycrystalline diamond (PCD) and monocrystalline diamond (MCD). PCD is made up of many small individual crystals bound together with a binder material, such as a cobalt binder. Cutting tools made of PCD can have a somewhat serrated edge due to the boundaries where the individual crystals are bound together. PCD cutting tools are often described by the average size of the crystals, also called grain size, and type of binder. When a PCD is used to cut a surface, marks from the cutting edge can appear on the surface which correspond to the grain boundaries between the crystals. These marks typically appear as lines on the workpiece surface. In contrast MCD is one continuous crystal which does not have grain boundaries. Since MCD does not have grain boundaries, it does not leave grain boundary marks from the cutting edge as in the case with PCD. It should be noted, however, that in a milling operation, both PCD and MCD cutters can leave marks due to an interrupted cut during the milling process. As described above, an interrupted cut is due to the cutter contacting the workpiece surface at each rotation of the spindle. The interrupted cutting can leave a scalloped surface on the workpiece.

Figure 5:
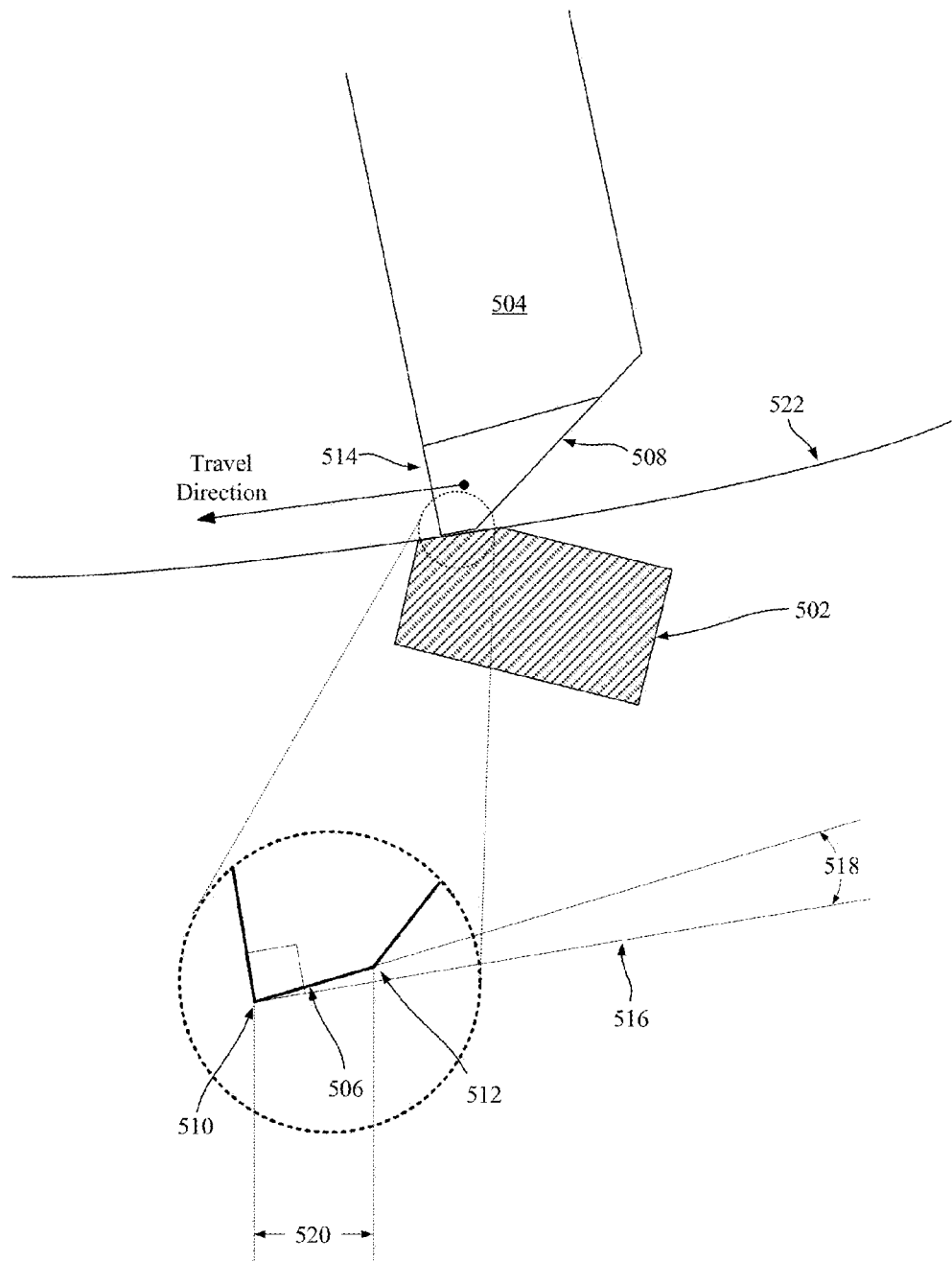
FIG. 5 illustrates a diamond cutter during a cutting procedure in accordance with described embodiments.

In order to lessen the scalloped portions of a cut surface and to produce a highly reflective and smooth finished surface, embodiments of the present disclosure include a diamond cutter having features graphically illustrated in FIG. 5. The top view and close up inset views illustrated in FIG. 5 show diamond cutter 504 cutting workpiece 102. Diamond cutter 504 includes three surfaces: rake face 514; land or primary clearance 506; and secondary clearance 508. Diamond cutter 504 is mechanically coupled to a shank (not shown), which is in turn mechanically coupled to a toll holder (not shown), which is in turn mechanically coupled to a milling machine (not shown). Cutting edge 510 of diamond cutter 504 rotates around the spindle axis of the milling machine at a cutting arc 522. Cutting arc 522 is a function of the cutting radius (e.g., 112 of FIG. 1) from the cutting edge 510 to the spindle axis (e.g., 110 of FIG. 1). Diamond cutter 504 can contact workpiece 502 at cutting edge 510, land 506 and heel 512. Since cutting edge 510, land 506 and heel 512 can come into contact with workpiece 502 during cutting, it is advantageous for these surface to be substantially free of defects caused, for example, by a lapping or polishing procedure in the manufacturing process of the diamond cutter. In preferred embodiments, cutting edge 510, land 506 and heel 512 have minimal visual imperfections such as lapping or polishing chips. In one embodiment for a MCD cutter, the cutting edge, land and heel have no visible imperfections at 500× magnification. In one embodiment for a PCD cutter, the cutting edge, land and heel have no visible imperfections at 100× magnification. It should be understood that lower or higher quality diamond cutters with greater or fewer imperfections can be used. Factors such as cost, availability and type of diamond cutters can be considered when determining the quality of diamond cutter used in a particular application. For example, an MCD cutter with a high quality cutting edge (e.g., very few visible imperfections) can be used in applications where the resultant cut surface is at a highly visible portion of an electronic device. A PCD cutter can be used, for example, in applications where the resultant cut surface can be slightly obscured by, for example, a dark anodizing film.

Before a cutting operation begins, diamond cutter 504 can be aligned such that the cutting edge 510 contacts workpiece 502 and effective primary clearance angle 518 puts land 506, and optionally heel 512, into contact with workpiece 502.

Example alignment procedures will be discussed in detail below with reference to FIGS. 8A and 8B. During cutting, diamond cutter 104 proceeds in the travel direction as show in FIG. 5. First, cutting edge 510 cuts the surface of workpiece 502 resulting in a second surface with peaks and troughs. Next, land 506, and optionally heel 512, can come into contact with workpiece 502 burnishing the surface and removing substantially all the peaks of the second surface, thereby providing a highly reflective and smooth finished surface on workpiece 502. The degree in which the peaks are removed depends on the amount of burnishing the land and heel impart on the surface. Details regarding removal of peaked portions of a scalloped surface in accordance with embodiments will be described below with reference to FIGS. 6A and 6B. Since the surface is highly reflective and smooth, there is no need for a subsequent traditional polishing process. In this way an entire polishing step can be removed from the manufacturing process. Note that in some embodiments, the effective primary clearance can be backed off the surface of workpiece 502 a small amount before cutting begins. In this backed off configuration, portions of land 506 can still come into contact and burnish workpiece 502 due to elastic recovery of workpiece 502 material during the cutting process. Using the cutter in this backed off configuration can extend the lifetime of diamond cutter 504.

Figure 6A:
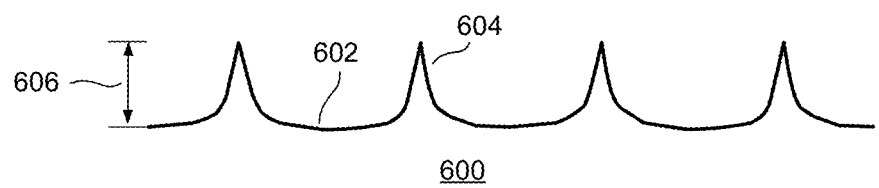
FIGS. 6A and 6B illustrate a selected profile of a part undergoing a cutting procedure in accordance with described embodiments.
Figure 6B:
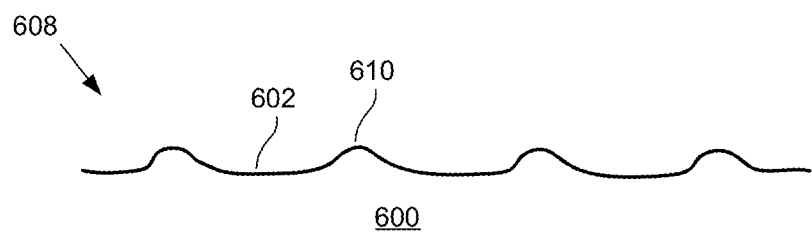

As discussed above, after a cutting edge of a diamond cutter cuts the surface of a workpiece, a scalloped surface can remain on the workpiece. To illustrate this graphically, reference will now be made to FIGS. 6A and 6B, which show cross sections of a surface of a workpiece undergoing a cutting procedure in accordance with described embodiments. In FIG. 6A, workpiece 600 has undergone cutting from only the cutting edge (510 in FIG. 5), leaving a second surface with peaks 604 and troughs 602. Peaks 604 can be caused by interrupted cutting due to the milling process as described above. In FIG. 6A, peaks 604 protrude a height 606 from trough 602. In FIG. 6B, workpiece 600 has been contacted by the land, and optionally heel, (506 and 512, respectively, in FIG. 5) reducing substantially all the height 606 of peaks 604, leaving a highly reflective finished surface 608. It is noted that there still can be remaining slightly protruding portions 610 on highly reflective and smooth finished surface 608, depending on the amount of burnishing (i.e. amount of rubbing), however surface 608 is generally highly reflective and smoothed to a mirror shine and generally does not require further polishing.

Figure 7A:
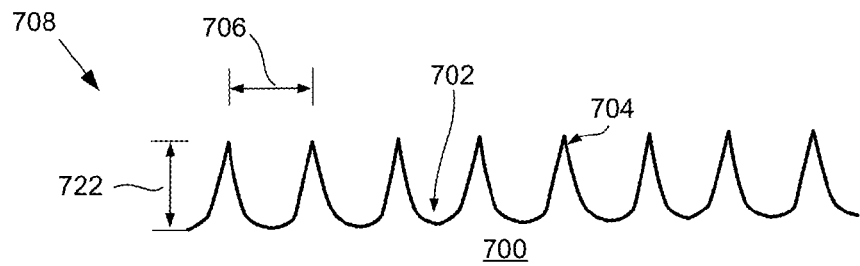
FIGS. 7A-7D illustrate selected profiles of two separate parts undergoing cutting procedures using two different diamond cutting tools in accordance with described embodiments.
Figure 7B:
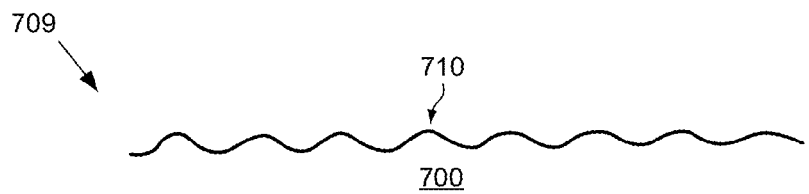

In order to obtain as smooth as possible highly reflective and smooth finished surface, in some embodiments the cutting radius (112 of FIG. 1) is relatively long. To illustrate graphically how the cutting radius effects the overall smoothness of the resulting surface, reference will now be made to FIGS. 7A-7D which show side views of two different workpieces undergoing cutting from two different diamond cutters in accordance with the described embodiments. FIGS. 7A and 7B show workpiece 700 undergoing a cutting procedure using an diamond cutter with a short cutting radius, and FIGS. 7C and 7D show workpiece 712 undergoing a cutting procedure using an diamond cutter with a long cutting radius.

At FIG. 7A, workpiece 700 has undergone cutting from the cutting edge of a diamond cutter assembly having a short cutting radius. That is, the distance between the cutting edge and the spindle axis is relatively short. After only cutting edge cuts workpiece 700, a second scalloped surface 708 with peaks 704 and troughs 702 is formed. Peaks 704 can be caused by the interrupted cutting due to milling process. The distance 706 between the peaks 704 is directly proportional to the cutting radius of the diamond cutting assembly. At FIG. 7B, workpiece 700 has been contacted by the land, and optionally the heel, reducing substantially all the height 722 of peaks 704, leaving a highly reflective and smooth finished surface 709 with remaining slightly protruding portions 710 which diminish the overall reflective and smooth appearance of a highly reflective and smooth finished surface 709.

Figure 7C:
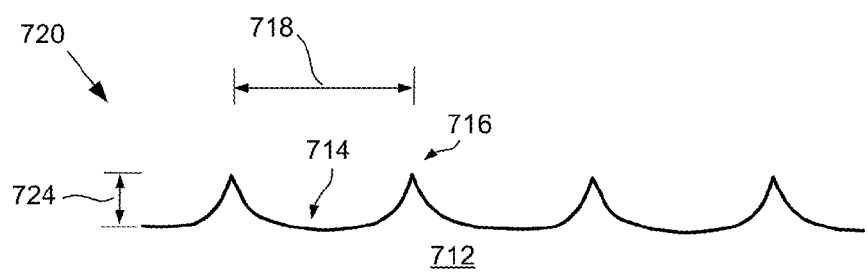
Figure 7D:
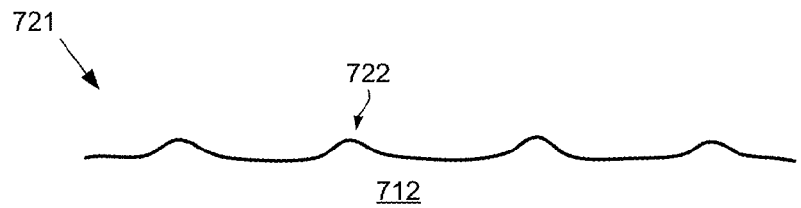

At FIG. 7C, workpiece 712 has undergone cutting from the cutting edge of a diamond cutter assembly having a short cutting radius. That is, the distance between the cutting edge and the spindle axis is relatively long. After only cutting edge cuts workpiece 712, a second scalloped surface 720 with peaks 716 and troughs 714 is formed. Since the distance 718 between the peaks 716 is directly proportional to the cutting radius of the diamond cutting assembly, distance 718 is longer than distance 706 of workpiece 700 at FIG. 7A. Thus, second surface 720 has a smaller portion having peak 716 compared to the second surface 708 of FIG. 7A. At FIG. 7D, workpiece 712 has been contacted by the land, and optionally the heel, reducing substantially all the height 724 of peaks 716, leaving a highly reflective and smooth finished surface 720 with remaining slightly protruding portions 722. Note that there are less remaining slightly protruding portions 722 in the highly reflective and smooth surface 720 compared to remaining slightly protruding portions 712 in the highly reflective and smooth surface 721. Therefore, using a diamond cutter assembly having a longer cutting radius can provide an improved overall highly reflective and smooth finished surface. In one embodiment the diamond cutter assembly has a cutting radius about 35 millimeters.

Since the cutting procedures described in the present technology requires a high level of accuracy regarding the surface geometry of the workpiece, the cutting tool should be aligned at a high level of accuracy relative to the workpiece surface before the cutting process begins. It can be difficult to manufacture diamond cutter to meet extremely high levels of specified dimensional and defect free specifications. Therefore, embodiments of the disclosure involve calibration procedures to compensate for any imperfections in the geometric dimensions of the diamond cutter. In one embodiment, calibration involves calibrating the cutter directly on the workpiece surface wherein the cutter is rotated until the cutting edge, land and heel (510, 506 and 512, respectively, in FIG. 5) contact the workpiece surface. In other embodiments, calibration involves rotating the cutter tool until the land (506 in FIG. 5) provides sufficient burnishing to the workpiece surface.

FIGS. 8A and 8B illustrate two different alignment or calibration procedures to optimize the amount and effectiveness of burnishing in accordance with described embodiments. In both FIGS. 8A and 8B, the diamond cutter is initially positioned in the milling machine for cutting. At FIG. 8A, diamond cutter 802 is calibrated by controlling the difference in length between first line 804 from spindle axis 808 to cutting edge 810, and a second line 812 from spindle axis 808 to heel 818. The length of first line 804 (R1) is measured and the length of second line 812 (R2) is measured. Measurement can be accomplished by using, for example, laser generated reference lines (shown by dotted lines). Next, a cutting operation is performed on a workpiece (not shown) using the R1 and R2 parameters. After the cutting operation is complete, the workpiece is inspected to determine the quality of cut, i.e., the reflectiveness and smoothness of the resulting cut surface. Next, the position of diamond cutter 802 is moved such that R1 is longer or shorter, i.e., land 814 and heel 818 are farther or closer to cutting arc 816. The bigger R2 is compared to R1, the more land 814 and heel 818 will rub the workpiece and the more burnishing the workpiece will experience. In this way, controlling the difference between R1 and R2 can control the amount of burnishing. In preferred embodiments, the difference between R1 and R2 are optimized to allow land 814 and/or heel 818 to sufficiently burnish the surface of the workpiece, but not rub so hard as to provide too much friction during cutting. Next, another cutting operation is performed and the workpiece is again inspected for quality of cut. If the quality of cut is not of an acceptable quality, the re-positioning of the diamond cutter 802, cutting and inspecting is repeated until an acceptable quality cut is achieved.

At FIG. 8B, diamond cutter 820 is positioned within the tool holder (not shown) by controlling the angle between reference line 822 from cutting edge 824 to spindle axis 832 and the land 826. Reference line 822 can be generated by using, for example, a laser generated line (shown by dotted line). Next, a cutting operation is performed on a workpiece (not shown) using a theta angle 834 parameter. After the cutting operation is complete, the workpiece is inspected to determine the quality of cut, i.e., the reflectiveness and smoothness of the resulting cut surface. Next, the position of diamond cutter 820 is moved such that theta 834 is larger or smaller, i.e., land 826 and heel 828 are farther or closer to cutting arc 830. The farther outside land 826 and heel 828 are to arc 830, the more land 826 and heel 828 will rub the workpiece and the more burnishing the workpiece will experience. In this way, controlling the angle theta can control the amount of burnishing. As with the alignment procedure shown in FIG. 8A, theta angle parameter 834 can be optimized to allow land 826 and heel 828 to sufficiently burnish the surface of the workpiece, but not rub so hard as to provide too much friction during cutting. As with the alignment procedure described for FIG. 8A above, the cutting, re-positioning and inspection can be repeated until an acceptable quality of cut is achieved.

During the alignment procedures shown in FIGS. 8A and 8B, in some embodiments the amount of burnishing can be backed off the cutting radius a small amount before cutting begins. As discussed above with reference to FIG. 5, use of the diamond cutter in a backed off configuration can extend the lifetime of diamond cutter. In this backed off configuration prior to cutting, the heel does not touch the workpiece. However, during cutting the land can still come into contact with and burnish the surface of the workpiece due to elastic recovery of the workpiece material. Factors such as diamond cutter lifetime, desired amount of burnishing and amount of diamond cutter friction on the workpiece can be considered when optimizing the alignment of the cutting tool.

Figure 9:
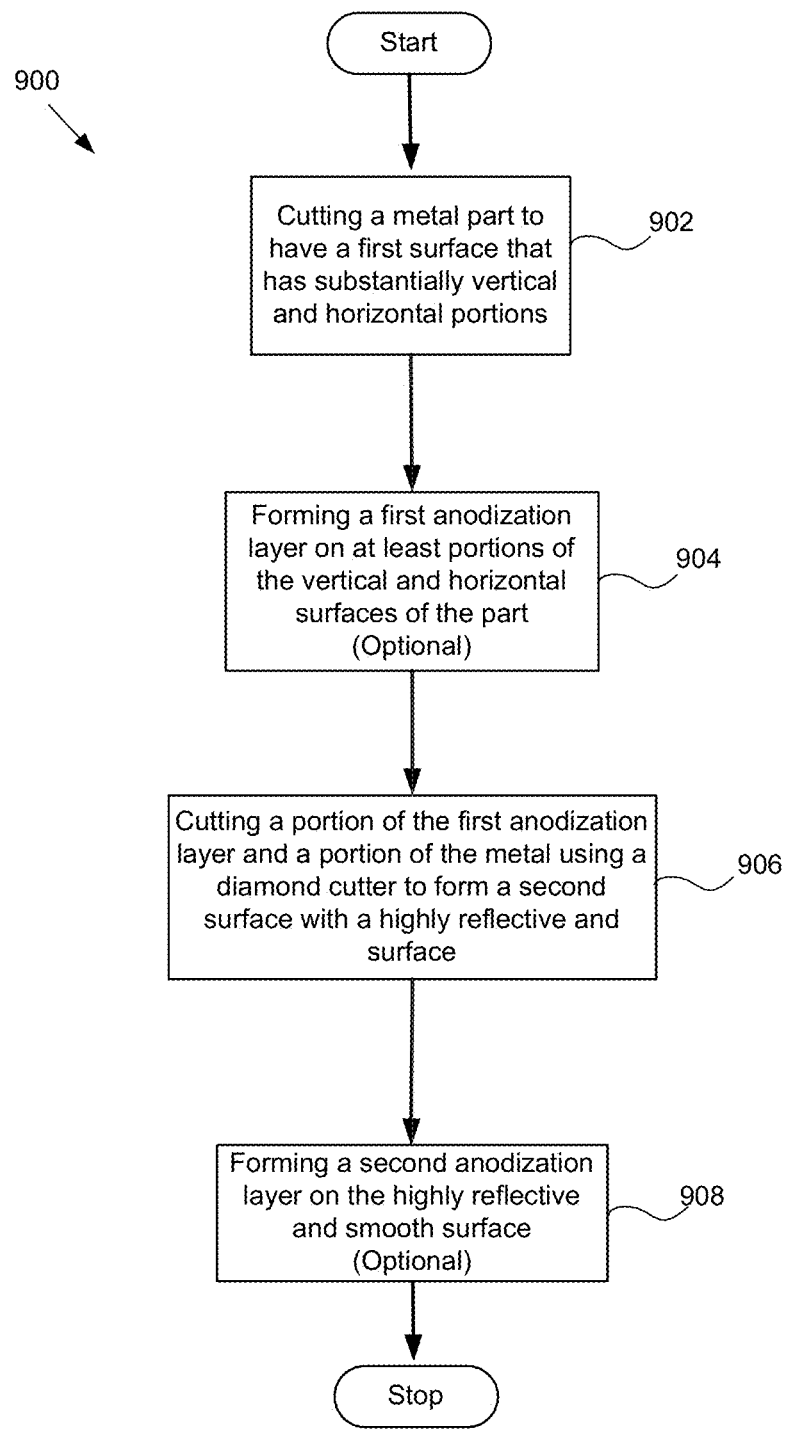
FIG. 9 is a flowchart illustrating a process which includes a cutting process graphically presented in FIGS. 10A-10D.

In described embodiments, the part can be cut at a substantially flat surface portion of the part wherein the substantially flat surface is given a highly reflective and smooth finish. Alternatively, the part can be cut at a portion of the part that has a feature with horizontal, vertical and angled surfaces. The diamond cutter can cut the feature to form a different feature that has a highly reflective and smooth finished surface. For instance, a chamfer may be cut at a corner or edge of a workpiece. The resulting chamfer will have a highly reflective and smooth finished surface in accordance with the described embodiments. In order to protect the highly reflective and smooth surface, an optional transparent coating or plating can be formed thereon. In certain embodiments, the transparent coating is an anodization layer that is substantially clear, thereby allowing the highly reflective surface to be visible through the anodization layer. FIGS. 9 and 10A-10D illustrate steps involved in a process of forming a feature with a highly reflective and smooth surface into a part in accordance with embodiments of the technology. FIG. 9 is a flowchart detailing process steps and FIGS. 10A-10D graphically present side views of a portion of a metal part undergoing the process described in FIG. 9. In the following narrative, reference will be made to the flowchart of FIG. 9 in conjunction with the side view presentations of FIGS. 10A-10D.

Figure 10A:
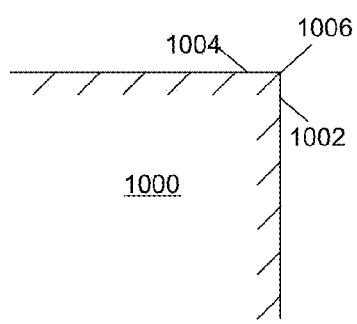
FIGS. 10A-10D graphically illustrate selected profiles of a part undergoing a cutting process described in the flowchart of FIG. 9.
Figure 10B:
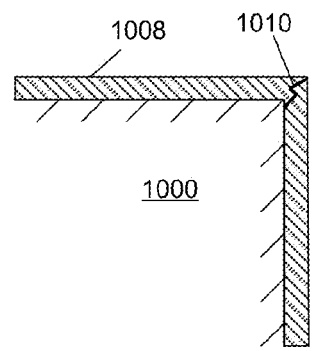

Process 900 begins at 902 (corresponding to FIG. 10A) where part 1000 is cut to have a first surface with vertical 1002 and horizontal 1004 portions. In FIG. 10A, the first surface has an edge 1006. Part 1000 can be cut using any number of suitable cutting procedures such as a machining procedure to form the shape of part 1000. It should be noted that substantially vertical 1002 and a horizontal 1004 portions in FIG. 10A-10D can form a edge 1006 having any angle, including a 90 degree angle. In addition, vertical 1002 and a horizontal 1004 portions can be substantially flat or they may be curved. The part can then undergo optional surface treatments such as polishing and/or addition of artwork (e.g., company logo and/or text) using, for example, a photolithography process. In one embodiment, a blasting operation can be performed whereby the part is exposed to blasting media to create a rough blasted surface over the part.

At 904 (corresponding to FIG. 10B), part 1000 undergoes an optional first anodization process to form a first anodization layer 1008 that covers at least portions of vertical 1002 and horizontal 1004 surfaces of part 1000 near edge 1006. Anodization layer 1008 serves to protect the metal surface of part 1000 from corrosion and scratching. In one embodiment, first anodization layer 1008 is approximately 8 to 12 microns thick and is substantially opaque so that the underlying metal of part 1000 is not substantially visible through first anodization layer 1008. Note that due to stress build up at edge 1006, first anodization layer 1008 can have cracks 1010.

Figure 10C:
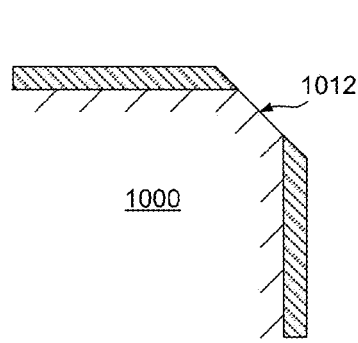
Figure 10D:
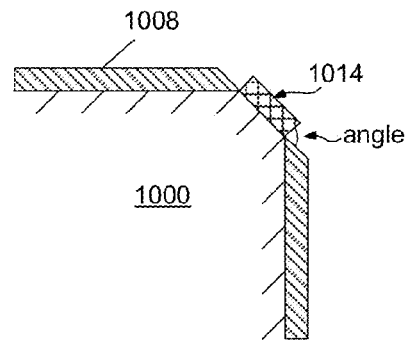

At 906 (corresponding to FIG. 10C), a portion of the optional first anodization layer 1008 and a portion of metal part 1000 is cut using an diamond cutter described above to form a second surface 1012 which is highly reflective and smooth surface. In certain embodiments, a portion of the optional first anodization layer 1008 and a portion of metal part 1000 are given a rough cut using a different cutting tool prior to using a diamond cutter tool. The rough cut can be made so as to remove a bulk amount of material before diamond cutter is used in accordance with described embodiments. The rough cut can be made using a suitable cutting tool such as a carbide or a metal cutter or a diamond cutter of lesser quality than the diamond cutter used to cut a highly reflective and smooth surface as described above. In FIG. 10C, the second surface is a chamfer. It should be noted that second surface 1012 can be cut at any angle relative to the horizontal 1004 and vertical 1002 portions. For example, second surface 1012 can be cut at a 45 degree angle relative to one of horizontal 1004 and vertical 1002 portions. Since second surface 1012 has a highly reflective and smooth surface, there is no need for subsequent polishing. This is advantageous, not only because it removes an extra step in the process, but also because traditional polishing techniques such as mechanical and chemical polishing, can erode features of the part. In particular, traditional polishing techniques can erode and round off sharp edges and corners such as the edges of chamfer 1012, reducing the aesthetic appeal of the part.

At 908 (corresponding to FIG. 10D), part 1000 undergoes an optional second anodization process to form a second anodization layer 1014 substantially only on and to protect the highly reflective and smooth chamfer 1014. It should be noted that the second anodization process can use different process parameters than the first anodization process described previously, forming second anodization layer 1014 with different physical characteristics than first anodization layer 1008. For example, second anodization layer 1014 can be substantially transparent in order to allow the underlying highly reflective and smooth chamfer 1015 to be viewable. In addition, the second anodization layer 1014 can be formed such that there is a clearly defined interface between first anodization layer 1008 and second anodization layer 1014 (shown by an angle in FIG. 10D). After process 900 is complete, the finished part in FIG. 10D has a highly reflective and smooth chamfer 1012 with sharply defined and cosmetically appealing edges.

Figure 11:
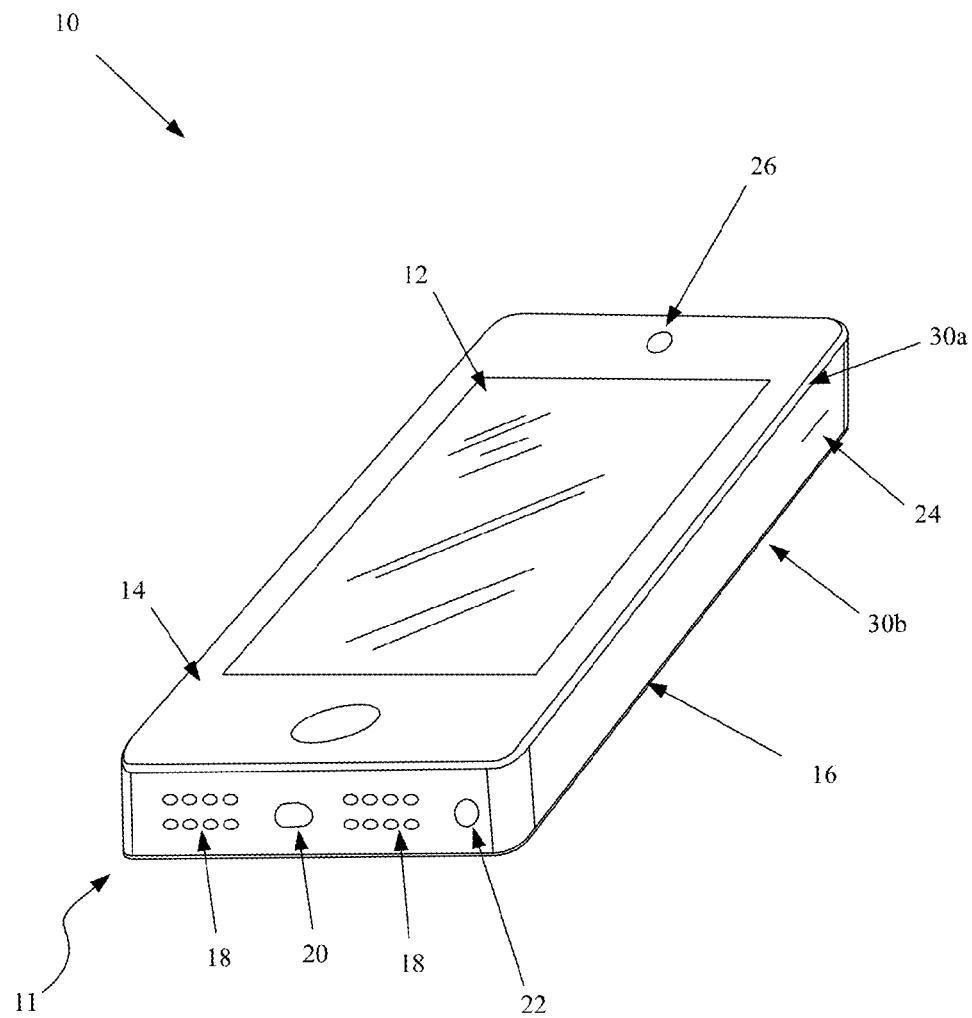
FIG. 11 is a schematic isometric view of a portable electronic device configured in accordance with an embodiment of the disclosure.

As discussed previously, tools and methods of the described embodiments can be applied in the fabrication of electronic devices, including for example, personal computers and portable tablets and phones. FIG. 11 is a schematic isometric view of a portable electronic device 10 ("electronic device 10"), such as a mobile telephone, configured in accordance with an embodiment of the disclosure. In the illustrated embodiment, the electronic device 10 includes a body 11 carrying a display 12 that allows a user to interact with or control the electronic device 10. For example, the display 12 includes a cover or cover glass 14 that is operably coupled to a frame, housing, or enclosure 16. In certain embodiments, the display 12 and/or cover glass 14 can include touch sensitive features to receive input commands from a user. Moreover, in certain embodiments a cover or cover glass can be positioned on one side of the electronic device 10, or a cover or cover glass can be positioned on opposing sides of the electronic device 10. As described in detail below, the enclosure 16 and the cover glass 14 at least partially house or enclose several internal features of the electronic device.

In the embodiment illustrated in FIG. 11, the enclosure 16 also at least partially defines several additional features of the electronic device 10. More specifically, the enclosure 16 can include audible speaker outlets 18, a connector opening 20, an audio jack opening 22, a card opening 24 (e.g., SIM card opening), a front facing camera 24, a rear facing camera (not shown), a power button (not shown), and one or more volume buttons (not shown). Although FIG. 11 schematically illustrates several of these features, one of ordinary skill in the art will appreciate that the relative size and location of these features can vary.

In certain embodiments, the enclosure 16 can be made from a metallic material. For example, the enclosure 16 can be made from Aluminum, such as 6063 Aluminum. In other embodiments, however, the enclosure 16 can be made from other suitable metals or alloys. According to additional features of the embodiment shown in FIG. 11, the enclosure 16 includes opposing edge portions 30 (identified individually as a first edge portion 30a and a second edge portion 30b) extending around a periphery of the body 11. In certain embodiments, one or both of the edge portions 30 can have a chamfered or beveled profile. As described in detail below, the chamfered edge portions 30 can be processed relative to the enclosure 16 to provide an aesthetically appealing appearance. For example, the exterior surface of the enclosure 16 can be treated and the edge portions 30 can subsequently be treated. In one embodiment, for example, a first anodization process can be applied to the enclosure 16 and a second subsequent anodization process can be applied to the edge portions 30. Additional suitable surface treatments, including intermediary surface treatments, can be applied to the enclosure 16 and/or the edge portions 30. In still further embodiments, the edge portions 30 can have other suitable profiles or shapes including and/or surface treatments.

Figure 12:
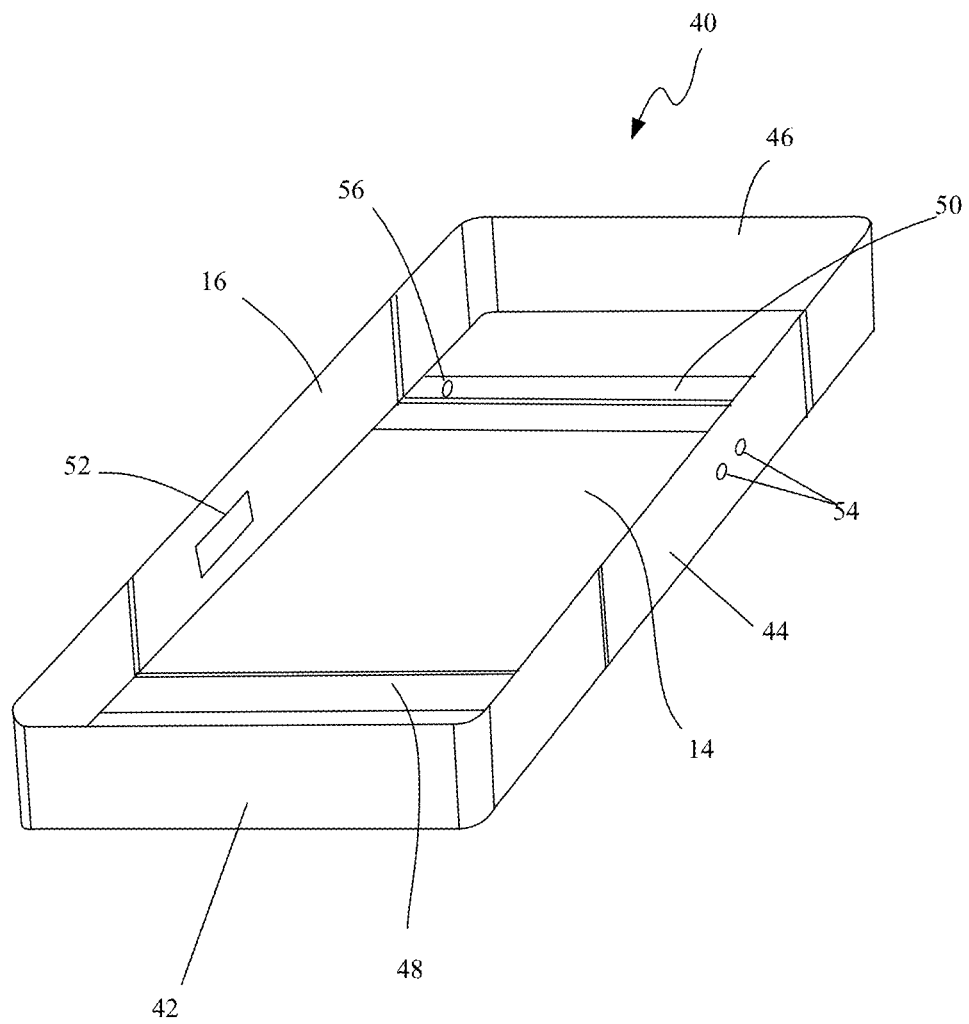
FIG. 12 is a schematic isometric view of at least a portion of a subassembly of the electronic device of FIG. 11.

FIG. 12 is a schematic isometric view of at least a portion of a subassembly 40 of the electronic device of FIG. 11. In the embodiment illustrated in FIG. 12, the subassembly 40 includes the enclosure 16 coupled to a cover glass, such as the cover glass 14 shown in FIG. 11. As shown in FIG. 12, the enclosure 16 includes a first enclosure portion 42 coupled to a second enclosure portion 44, which is in turn coupled to a third enclosure portion 46. More specifically, the enclosure 16 includes a first connector portion 48 that couples the first enclosure portion 42 to the second enclosure portion 44. The enclosure also includes a second connector portion 50 that couples the second enclosure portion 44 to the third enclosure portion 46. In certain embodiments, the first, second, and third enclosure portions 42, 44, and 46 can be metallic and the first and second connector portions 48, 50 can be made from one or more plastic materials. As described below in detail, for example, each of the first and second connector portions 48, 50 can be formed from a two shot plastic process that includes a first plastic portion that joins the corresponding enclosure portions and a second cosmetic plastic portion that at least partially covers the first plastic portions. As further described in detail below, these plastic portions can be configured to withstand harsh manufacturing processes and chemicals that may be used to form and process the enclosure. In further embodiments, the enclosure portions 42, 44, and 46 and/or the connecting portions 48, 50 can be made from other suitable materials including metallic, plastic, and other suitable materials.

According to additional features of the embodiment illustrated in FIG. 10, the enclosure 16 can include one or more low resistance conductive portions 52 (shown schematically) for grounding purposes. Conductive portions 52 can include, for example, of aluminum which can shield RF waves. The conductive portion 52 can be formed by removing one or more layers or portions of the enclosure 16 to provide a lower resistance through the enclosure 16 for antenna transmissions or communications. In certain embodiments, for example, the conductive portion 52 can be formed by laser etching or otherwise removing or etching an anodized portion of the enclosure 16.

The illustrated subassembly 40 also includes several inserts 54 that provide increased structural connection strength relative to the enclosure 16. In embodiments where the enclosure 16 is formed from Aluminum, for example, the inserts 54 can provide increased strength and durability. More specifically, in certain embodiments the inserts 54 can include titanium threaded inserts or nuts that are configured to threadably engage a corresponding fastener. Titanium inserts 54 can be advantageous in that the titanium material can withstand harsh manufacturing processes and chemicals. In other embodiments, however, the inserts 54 can be made from other suitable materials including, for example, steel, brass, etc.

According to yet additional features of the subassembly 40 shown in FIG. 12, and as described in detail below, the cover glass 14 can be securely coupled and/or offset (if desired) relative to the enclosure 16. More specifically, the cover glass 14 can be aligned with a reference plane or datum relative to the enclosure 16, and the enclosure 16 (and more specifically the first enclosure portion 42, the second enclosure portion 44, and/or the third enclosure portion 46)

can include one or more access opening 56 to urge or bias the cover glass 14 relative to the enclosure 16 for secure attachment (e.g., adhesive attachment) while maintaining relatively tight tolerances between the coupled portions.

According to additional embodiments of the disclosure, and as described in detail below, the cover glass 14 can be made from a glass, ceramic, and/or glass-ceramic material. In one embodiment, for example, the cover glass 14 can be made from a glass with specific portions or volumes of the glass formed with ceramic properties. In other embodiments, however, the cover glass 14 can be formed from alumina silica based pigmented glass.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A cutting tool assembly comprising:
a holder configured to rotate about an axis; and
a cutting tool radially attached to the holder such that the cutting tool rotates about the axis during a cutting operation, the cutting tool comprising:
a shank having a first end secured to the holder, and
a cutter attached to a second end of the shank opposite the first end, the cutter comprising a cutting edge, a heel and a land corresponding to a substantially flat surface between the cutting edge and the heel, wherein during the cutting operation the cutting edge and the land are substantially parallel to the axis, wherein the cutting edge cuts material from a workpiece to form a surface of the workpiece having peaks and troughs, and the land removes at least a portion of the peaks, thereby burnishing the surface of the workpiece, wherein a relative angle of the land with respect to the cutting edge is adjustable so as to control an amount of burnishing by the land.

2. The cutting tool assembly as recited in claim 1, wherein the heel engages with the surface of the workpiece during the cutting operation.

3. The cutting tool assembly as recited in claim 1, wherein a distance between successive peaks is proportionally related to a cutting radius, the cutting radius being a measurement from the axis to the cutting edge.

4. The cutting tool assembly as recited in claim 1, wherein the shank is in a substantially perpendicular orientation with respect to the axis during the cutting operation.

5. The cutting tool assembly as recited in claim 1, wherein the holder is configured to be positioned in a milling machine.

6. The cutting tool assembly as recited in claim 5, wherein the cutting tool is configured to cut the workpiece in an interrupted cutting operation wherein the cutting tool engages with and disengages from the workpiece a plurality of times.

7. The cutting tool assembly as recited in claim 1, wherein the shank and the cutter are attached using a braising procedure.

8. The cutting tool assembly as recited in claim 1, wherein the cutting tool assembly includes a plurality of cutting tools radially attached to the holder.

9. A method of cutting a workpiece using a cutting tool assembly, the cutting tool assembly comprising:
a holder configured to rotate about an axis; and
a cutting tool radially attached to the holder, the cutting tool comprising:
a shank having a first end secured to the holder, and
a cutter attached to a second end of the shank opposite the first end, the cutter comprising a cutting edge, a heel and a land disposed between the cutting edge and the heel, wherein the heel is recessed relative to the cutting edge with respect to a cutting arc of the cutter, wherein during a cutting operation:
the cutting edge and the land are substantially parallel to the axis,
the cutting tool rotates about the axis such that the cutting edge removes material from the workpiece to form peaks and troughs on a surface of the workpiece, and
the land removes at least a portion of the peaks, thereby smoothing the surface of the workpiece; and
wherein cutting the workpiece includes adjusting a relative angle of the land with respect to the cutting edge so as to control an amount of burnishing by the land.

10. The method as recited in claim 9, wherein a distance between successive peaks is proportionally related to a cutting radius, the cutting radius being a measurement from the axis to the cutting edge.

11. The method as recited in claim 9, wherein the heel engages with the surface of the workpiece during the cutting operation.

12. The method as recited in claim 9, wherein the cutter is comprised of diamond.

13. A cutting tool assembly comprising:
a holder configured to rotate about an axis; and
a cutting tool radially attached to the holder, the cutting tool comprising:
a shank having a first end secured to the holder, and
a cutter attached to a second end of the shank opposite the first end, the cutter comprising a cutting edge, a heel and a land disposed between the cutting edge and the heel, wherein the heel is recessed relative to the cutting edge with respect to a cutting arc of the cutter, and wherein a relative angle of the land with respect to the cutting edge is adjustable, wherein during a cutting operation:
the cutting edge and the land are substantially parallel to the axis,
the cutting tool rotates about the axis such that the cutting edge removes material from a workpiece to form peaks and troughs on a surface of the workpiece, and
the land removes at least a portion of the peaks, thereby smoothing the surface of the workpiece.

14. The cutting tool assembly as recited in claim 13, wherein cutting tool corresponds to a first cutting tool having a first shank and a first cutter, wherein the cutting tool assembly includes a second cutting tool having a second shank and a second cutter, the second cutter including a second cutting edge and a second land that are substantially parallel to the axis.

15. The cutting tool assembly as recited in claim 13, wherein the shank is in a substantially parallel orientation with respect to the axis during the cutting operation.

16. The cutting tool assembly as recited in claim 13, wherein the cutter is comprised of diamond.

17. The cutting tool assembly as recited in claim 16, wherein the cutter is comprised of a polycrystalline diamond or a mono crystalline diamond.

18. The cutting tool assembly as recited in claim 13, wherein the holder is cylindrical in shape.

* * * * *